US009285400B2

(12) United States Patent
Mehringer et al.

(10) Patent No.: US 9,285,400 B2
(45) Date of Patent: Mar. 15, 2016

(54) METHOD FOR DETERMINING CURRENT IN A POLYPHASE MACHINE

(75) Inventors: Paul Mehringer, Stuttgart (DE); Kurt Reutlinger, Stuttgart (DE)

(73) Assignee: ROBERT BOSCH GMBH, Stuttgart (DE)

(*) Notice: Subject to any disclaimer, the term of this patent is extended or adjusted under 35 U.S.C. 154(b) by 151 days.

(21) Appl. No.: 14/119,500

(22) PCT Filed: May 10, 2012

(86) PCT No.: PCT/EP2012/058611
§ 371 (c)(1),
(2), (4) Date: Mar. 6, 2014

(87) PCT Pub. No.: WO2012/163645
PCT Pub. Date: Dec. 6, 2012

(65) Prior Publication Data
US 2014/0204972 A1  Jul. 24, 2014

(30) Foreign Application Priority Data
May 30, 2011 (DE) .......................... 10 2011 076 722

(51) Int. Cl.
G01R 19/00 (2006.01)
G01R 27/02 (2006.01)
G01R 31/34 (2006.01)
H02P 6/00 (2006.01)
H02P 25/02 (2006.01)
H02P 25/22 (2006.01)

(52) U.S. Cl.
CPC ............ *G01R 19/0092* (2013.01); *G01R 27/02* (2013.01); *G01R 31/343* (2013.01); *H02P 6/002* (2013.01); *H02P 25/02* (2013.01); *H02P 25/22* (2013.01)

(58) Field of Classification Search
CPC .......................... G01R 19/0092; G01R 27/01
See application file for complete search history.

(56) References Cited

U.S. PATENT DOCUMENTS

| 7,504,790 | B2* | 3/2009 | Tsuji et al. ..................... 318/432 |
| 7,919,946 | B2* | 4/2011 | Ehlich ................ G01R 19/2513 318/34 |
| 8,395,338 | B2* | 3/2013 | Kuroda et al. ........... 318/400.11 |
| 8,829,919 | B2* | 9/2014 | Alho ..................... G01R 31/42 324/548 |
| 2008/0116840 | A1* | 5/2008 | Welchko et al. .............. 318/801 |
| 2008/0150515 | A1* | 6/2008 | Ollila et al. .................... 324/85 |
| 2009/0174350 | A1* | 7/2009 | Kuroda et al. ........... 318/400.11 |

(Continued)

FOREIGN PATENT DOCUMENTS

| CN | 101207337 A | 6/2008 |
| CN | 101918852 A | 12/2010 |

(Continued)

OTHER PUBLICATIONS

International Search Report for PCT/EP2012/058611, dated Aug. 19, 2013.

*Primary Examiner* — Jermele M Hollington
(74) *Attorney, Agent, or Firm* — Kenyon & Kenyon LLP

(57) ABSTRACT

In a method for determining current in a polyphase machine connected to a DC voltage source, a DC link is provided with a DC-link capacitor and, per phase, a high-side switch and a low-side switch. A measurement of the voltage curve across the DC-link capacitor is undertaken. The current of the DC voltage source and/or one or a plurality of phase currents are/is determined from the measured voltage curve.

8 Claims, 6 Drawing Sheets

(56) References Cited

U.S. PATENT DOCUMENTS

| | | | |
|---|---|---|---|
| 2010/0194316 A1* | 8/2010 | Eisenhardt | H02P 21/0035 318/400.02 |
| 2010/0295554 A1* | 11/2010 | Alho | 324/548 |
| 2014/0191698 A1* | 7/2014 | Magini et al. | 318/503 |
| 2014/0340017 A1* | 11/2014 | Raichle | H02M 7/53871 318/490 |

FOREIGN PATENT DOCUMENTS

| | | |
|---|---|---|
| DE | 10 2010 001 774 | 8/2011 |
| EP | 0 977 337 | 2/2000 |
| EP | 1 936 794 | 6/2008 |
| EP | 2 166 635 | 3/2010 |
| WO | WO 96/23347 | 8/1996 |
| WO | WO 2009/092848 | 7/2009 |

* cited by examiner

METHOD FOR DETERMINING CURRENT IN A POLYPHASE MACHINE

BACKGROUND OF THE INVENTION

1. Field of the Invention

The present invention relates to a method for determining current in a polyphase machine.

2. Description of the Related Art

Electrical rotating field drives are generally known. As described in the German Patent Application DE 10 2010 001 774, different types of modulation are used. Pulse width modulation (PWM) is commonly used in rotating field drives. In such rotating field drives, a feedback control is carried out as a function of the particular requirements in accordance with one of the following methods:

- use of a sinusoidal current control (sinusoidal commutation);
- use of a square-wave current control (square-wave current supply);
- use of square-wave voltages (control by square-wave voltages);
- use of a sinusoidal voltage control with superimposed zero voltages.

In principle, the aforementioned techniques can be used for electrical machines having any given number of phases. Most frequently encountered in practice are electrical machines having three phases. However, there are also electrical machines that have a different number of phases, such as one, two, four, five, six, seven or nine phases.

Moreover, what are generally referred to as start-stop systems are generally known. These serve the purpose of stopping and restarting a combustion engine in order to reduce fuel consumption and exhaust emissions.

A start-stop system developed by the Applicant operates on the basis of conventional starters. The starter in question is driven by an electronic control unit and engages via a pinion into a ring gear provided on the flywheel.

A starter generator operated in belt drive (RSG) has also already been realized that is based on a claw-pole generator having an additional electronic control unit. In the case of such starter generators, the phases are often directly connected via electronic semiconductor switches to a DC-voltage source, for example, a battery, without the use of a clock pulse method, such as PWM, for example.

To be able to recuperate higher energies during braking, there is a need for higher-voltage systems. To start the combustion engine at higher voltages, a pulsing of the supply voltage in the converter is needed in order to limit the current in the machine to a predefined maximal value. A clocked converter requires a DC link having high-capacitance capacitors in order to smooth the alternating components in the input current. In the output stages, the space requirements for the particular output stage are often determined by the dimensioning of the DC links.

As had been explained above in connection with the mentioned machines, operating modes that employ clock pulse methods (PWM) at higher voltages and operating modes that employ block commutations (without PWM) at lower voltages or at higher speeds are used. In the clock pulse methods, a current measurement is of particular importance since, in these methods, a current control is carried out that requires measuring the actual currents.

To measure current in the individual phases of the electrical machine, either shunt resistors are used that convert the current into an equivalent voltage signal, or indirect current measurement methods are used, such as those that employ current transducers or LEM transducers, for example.

FIG. 1 shows a DC voltage source, for example, a five-phase electrical machine connected to a battery B, that has a generator 1, a power electronics 2, and a DC link 3. In the interior thereof, generator 1 has five phase connections that are linked via phase conductors to branches Z1 through Z5 of power electronics 2. As indicated in FIG. 1, phase currents I_X through I_Y flow in the phase conductors.

Branch Z1 of power electronics 2 contains a high-side switch HS1 and a low-side switch LS1 and is connected at a connection point between these two switches via a phase conductor to generator 1.

Branch Z2 of power electronics 2 contains a high-side switch HS2 and a low-side switch LS2 and is connected at a connection point between these two switches via a phase conductor to generator 1.

Branch Z3 of power electronics 2 contains a high-side switch HS3 and a low-side switch LS3 and is connected at a connection point between these two switches via a phase conductor to generator 1.

Branch Z4 of power electronics 2 contains a high-side switch HS4 and a low-side switch LS4 and is connected at a connection point between these two switches via a further phase conductor to generator 1.

Branch Z5 of power electronics 2 contains a high-side switch HS5 and a low-side switch LS5 and is connected at a connection point between these two switches via a further phase conductor to generator 1.

DC link 3 of the illustrated machine has a DC-link capacitor 3a.

The switches of power electronics 2 receive the control signals from a control unit (not shown) in order to generate a rotating field upon machine startup.

As is readily apparent from FIG. 1, the following relation holds for the currents flowing in the machine:

$$I\_Bat = 1\_Gen + I\_ZK$$

In this context, I_Bat is the current of the DC voltage source; I_Gen is the generator current; and I_ZK is the DC link voltage.

In the case of an electrical machine as shown in FIG. 1, it is already known for current measurements to be taken using shunt resistors in the phase conductors between branches Z1 through Z5 and generator 1. This is illustrated in FIG. 2. Here, the disadvantage is that very high power losses occur in all operating modes of the electrical machine. They lead to unwanted further heating of the output stage region during the entire working operation of the machine. This is because the full operating current of the machine flows through the shunt resistors.

Moreover, in the case of an electrical machine as shown in FIG. 1, it is already known for current measurements to be taken using shunt resistors that are configured in the branches of power electronics 2, for example, in the low-side region of the particular branch. This is illustrated in FIG. 3. This is also associated with the disadvantage that very high power losses occur in all operating modes of the electrical machine that lead to unwanted additional heating of the output stage region during the entire working operation of the machine. This is because the full operating current of the machine flows through the shunt resistors.

The current measurements illustrated in FIGS. 2 and 3 are associated with the further disadvantages that a comparatively high number of evaluation circuits must be made available, and it is not possible to measure the current of the DC voltage source using this configuration. It is merely possible in these configurations to estimate the current of the DC voltage source as a function of the measured phase currents and the activation durations.

BRIEF SUMMARY OF THE INVENTION

In contrast, a method according to the present invention advantageously overcomes the above described, related-art disadvantages. In particular, no unwanted additional heating of the output stage region occurs, and there is no need for a large number of evaluation circuits. In a method for determining current in a polyphase machine, which has a DC link provided with a capacitor and, per phase, a high-side switch and a low-side switch, these advantages are achieved in that the current is determined using a voltage measurement in the DC link.

DETAILED DESCRIPTION OF THE INVENTION

Figure 1:
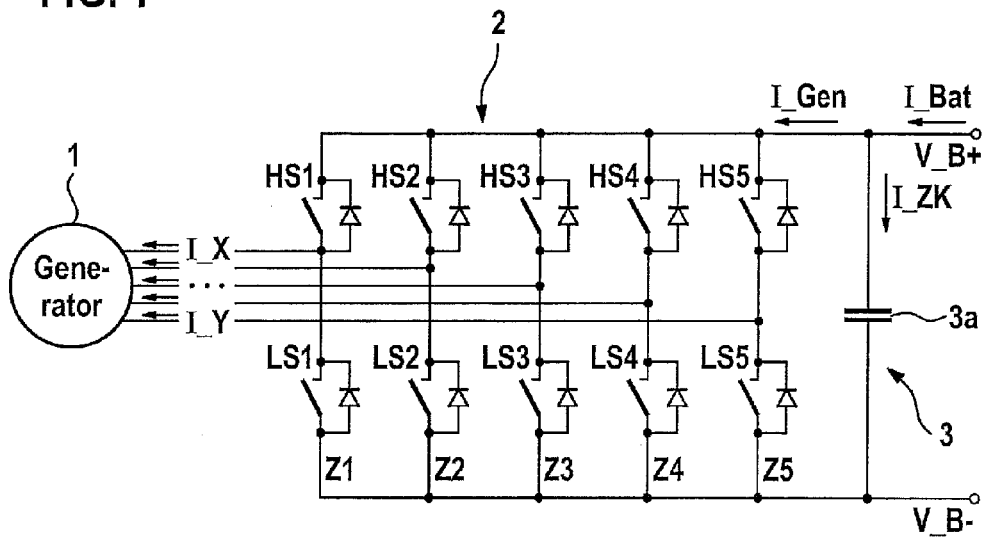
FIGS. 1-3 show a five-phase machine in the context of known measurement methods.
Figure 2:
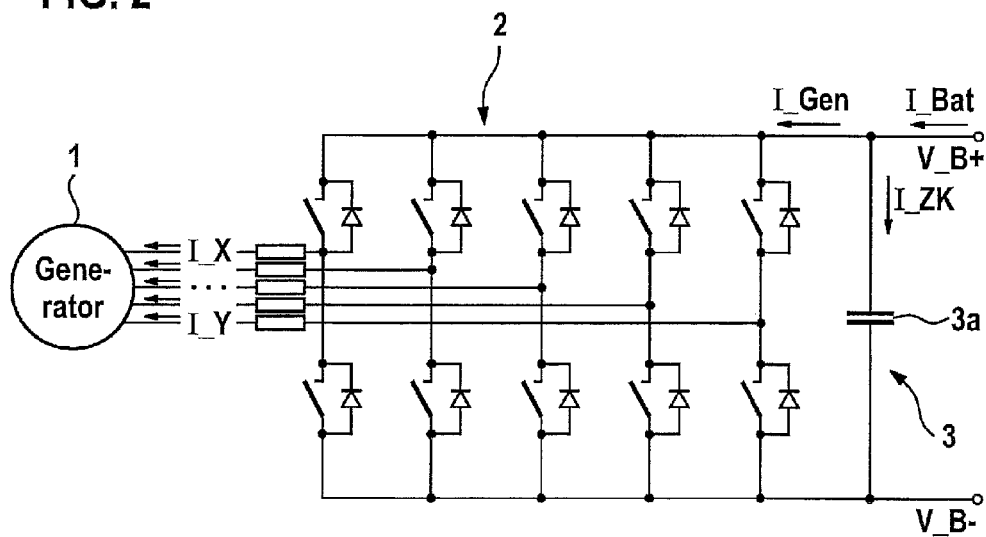
Figure 3:
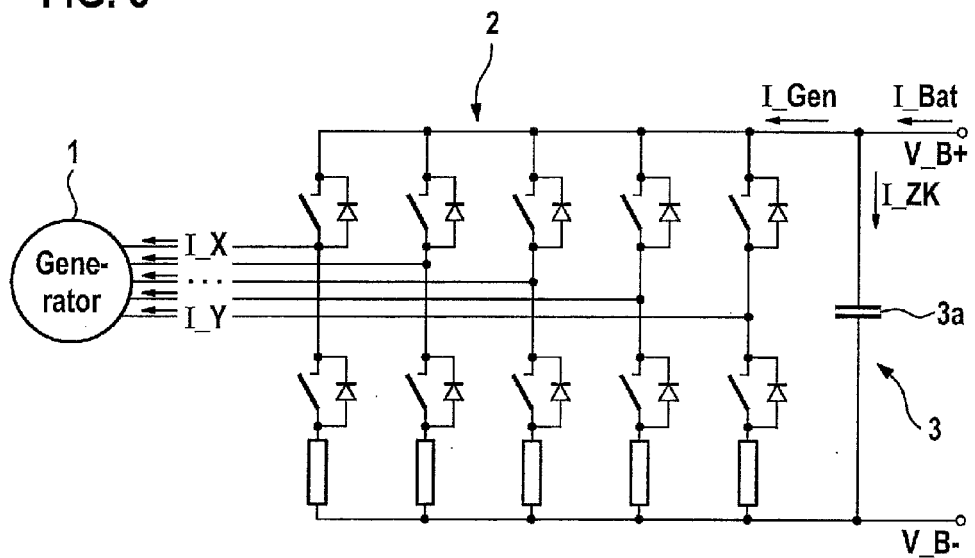
Figure 4:
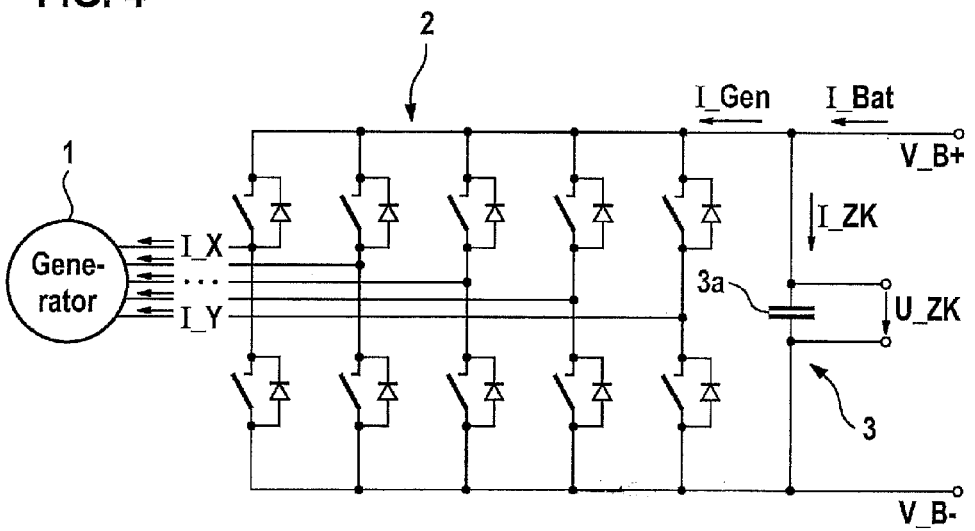
FIG. 4 shows a five-phase machine, where a voltage measurement is carried out in the DC link.

FIG. 4 shows a DC voltage source, for example, a five-phase machine connected to a battery, where a voltage measurement is carried out in the DC link. This voltage measurement is performed on DC-link capacitor 3a, which is configured between the terminals of the DC voltage source, for example, between the terminals of the vehicle battery, and provides information on DC link voltage U_ZK currently present on DC-link capacitor 3a. The further configuration of the machine conforms with the machine shown in FIG. 1.

For every point in time, the following relation holds for DC link voltage U_ZK of the machine:

$$U\_ZK = I\_ZK \cdot ESR + \frac{1}{C}\int i_{ZK} dt,$$

C being the capacitance of the DC-link capacitor, and ESR the internal resistance of the DC-link capacitor. For a constant current I_ZK, it holds that:

$$U\_ZK = I\_ZK \cdot ESR + U_o + \frac{I\_ZK}{C} \cdot \Delta t.$$

It is, therefore, possible for the capacitor current to be determined by observing the capacitor voltage.

Figure 5:
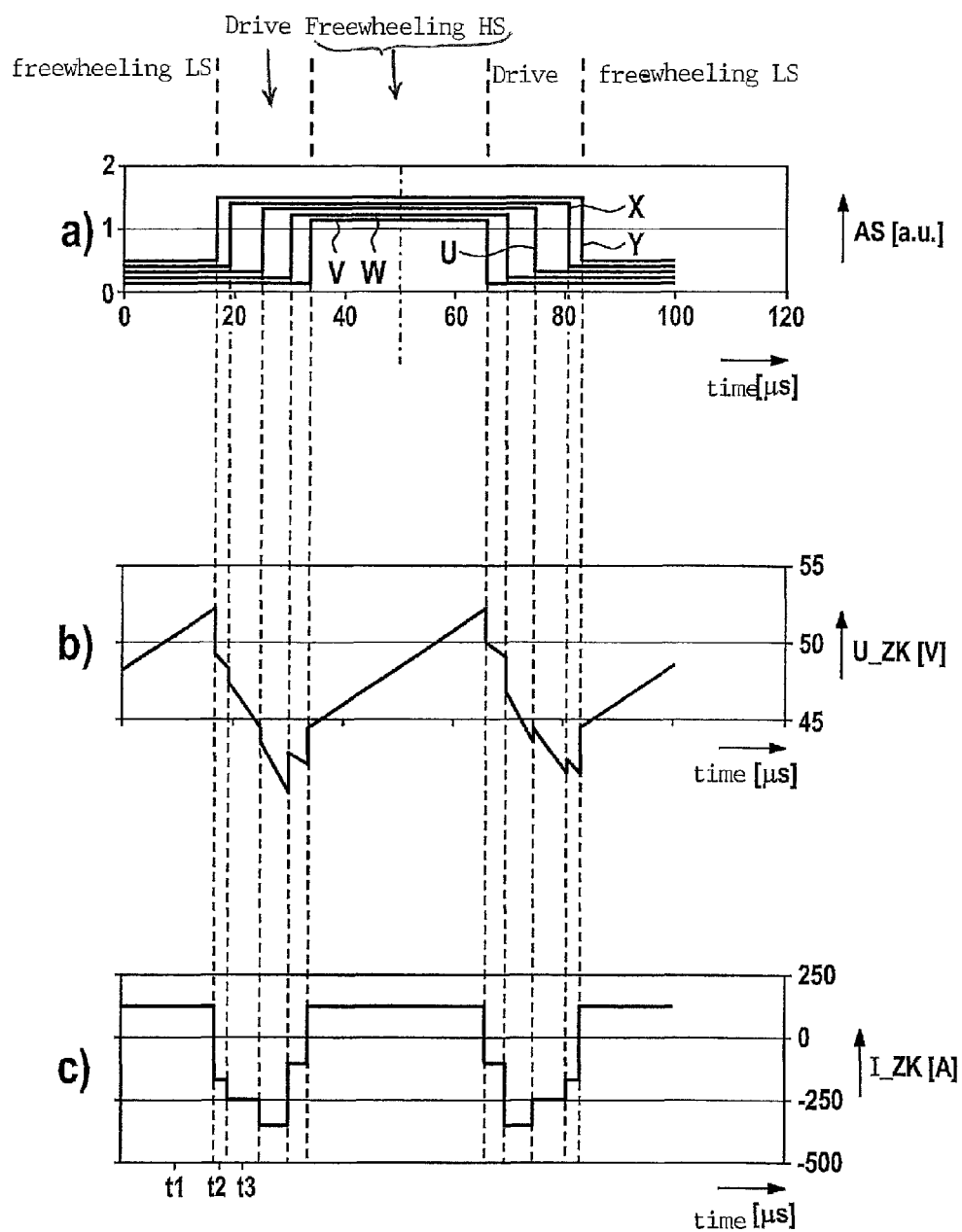
FIG. 5 shows diagrams for illustrating a center-aligned control pattern, the DC link voltage occurring in the process, and the DC link current occurring in the process.

The power electronics switches are controlled by what is generally referred to as a center-aligned control, for example. In this control, the time period for the current flow is concentrated into a short time period. The diagrams shown in FIG. 5 illustrate a control pattern for this type of center-aligned control, the corresponding characteristic curve of the DC link voltage and the corresponding characteristic curve of the DC link current. FIG. 5a illustrates drive signals AS for the switches of the power electronics; FIG. 5b, DC link voltage U_ZK; and, FIG. 5c, corresponding DC link current I_ZK.

It is readily apparent from FIG. 5a that, in the case of a center-aligned control, the pulse centers of the control pulses are in sync, as is indicated by a vertical dotted line in FIG. 5a. It is also discernible from FIG. 5a that the flanks of the control pulses differ from one another over time and are disposed within a limited time range. The text "freewheeling LS indicates that all low-side switches are switched through in this time interval. The text "freewheeling HS" indicates that all high-side switches are switched through in this time interval. The text "drive" expresses that, in this narrow time window, the electrical machine is connected by the switch settings to the external voltage. This induces a change in the current in the stator windings of the machine. If a control pulse is at the high voltage level thereof, then the corresponding high-side switch is switched through. If a control pulse is at the low control level thereof, then the corresponding low-side switch is switched through.

FIG. 5b illustrates the characteristic curve of DC link voltage U_ZK, which results in the case of a center-aligned control in accordance with FIG. 5a. It is apparent that a voltage jump occurs in FIG. 5b in response to each switching operation in accordance with FIG. 5a, and that a linearly rising or a linearly falling voltage curve, i.e., a ramp is present between two successive voltage jumps.

From the characteristic curve of DC link current I_ZK shown in FIG. 5c, it is apparent that, in the case of a center-aligned control in accordance with FIG. 5a, an abrupt current variation occurs in response to every switching operation, and that a constant current characteristic curve is present between two successive sudden current variations.

A comparison of FIGS. 5b and 5c reveals that, in response to a sudden current variation, a voltage jump also occurs, and that, in response to a constant current characteristic curve, a linearly rising or a linearly falling voltage curve is present.

It is readily apparent from the above explanations pertaining to FIG. 5 that the DC link current flowing through DC-link capacitor 3a is uniquely defined at every instantaneous point in time.

The composition of the DC link current flowing through DC-link capacitor 3a at different points in time is clarified exemplarily in the following with reference to FIGS. 6, 7 and 8; in contrast to the preceding figures, the phase currents being denoted in these figures by I1, I2, I3, I4 and I5.

Figure 6:
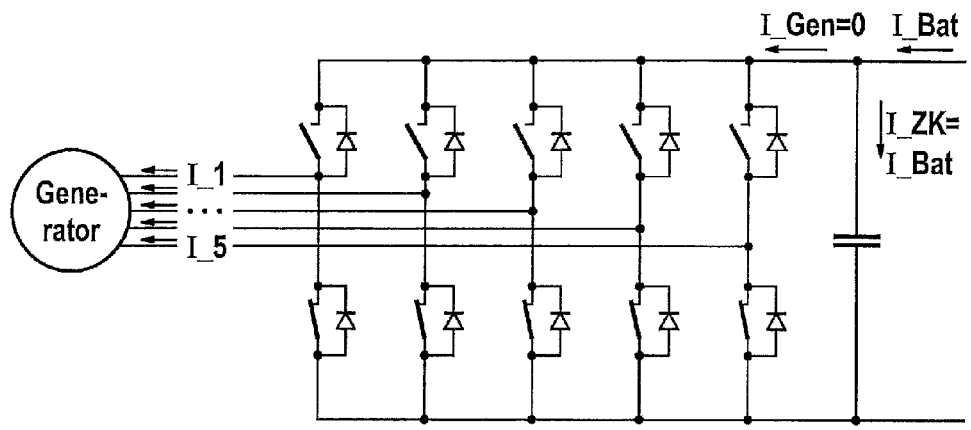
FIGS. 6-8 show various switch positions of the power electronics and the particular corresponding composition of the DC link current flowing through the DC-link capacitor.

In accordance with FIG. 6, all high-side switches are open, and all low-side switches are switched through, respectively closed. In this state of the switches, the current of DC voltage source I_Bat may be determined by measuring DC link current I_ZK flowing through DC-link capacitor 3a. It always holds then in this state that:

I_Gen=0 and

I_Bat=I_ZK.

The time periods during which all high-side switches are open and all low-side switches are switched through, respectively closed, are denoted in FIG. 5a by the text "freewheeling LS." One possible measurement point in time is denoted in FIG. 5c by t1.

Figure 7:
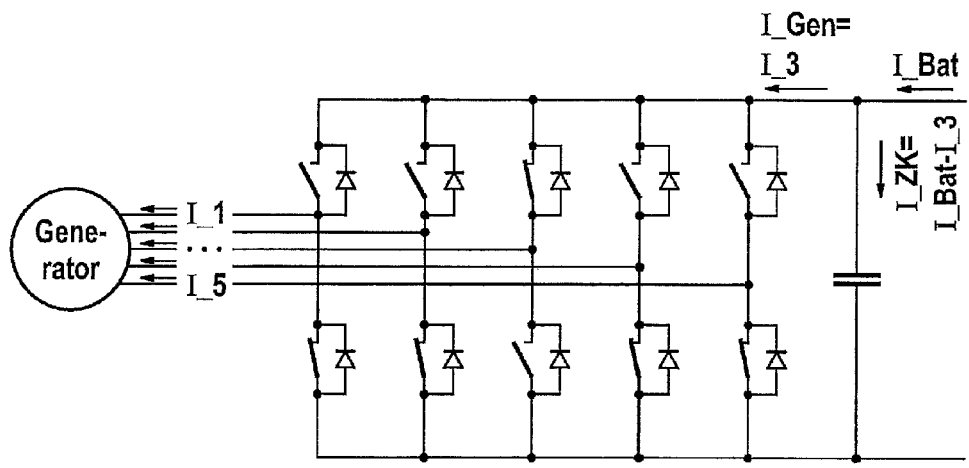

If—as is illustrated in FIG. 7—high-side switch HS3 is closed, and corresponding low-side switch LS3 is open, then the following relation holds:

$$I\_3 = I\_Bat - I\_ZK.$$

Therefore, given an already known current of the DC voltage source, phase current I_3 may be ascertained by the above relation using subtraction to compute the difference between the current of the DC voltage source and the DC link current measured during the time period following the connection of first phase current I_3. One possible measurement point in time is denoted in FIG. 5c by t2.

Figure 8:
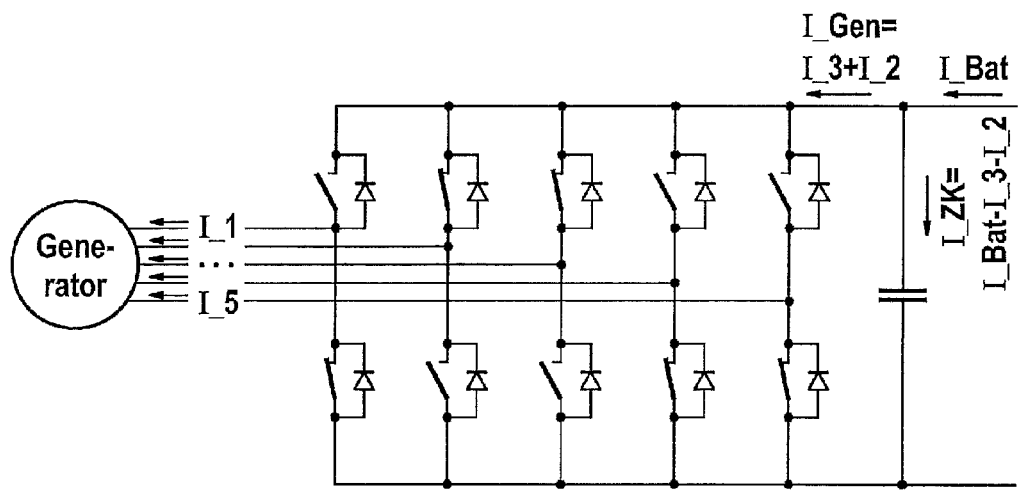

If—as is illustrated in FIG. 8—high-side switch HS2 is closed and corresponding low-side switch LS2 is open, then the following relation holds:

$$I\_2 = I\_Bat - I\_ZK - I\_3.$$

Therefore, given an already known current of the DC voltage source and already known phase current I_3, inferences may be made about phase current I_2 by applying the above relation in that the DC link current is measured during the time period following the connection of second phase current I_2. One possible measurement point in time is denoted in FIG. 5c by t3.

Accordingly, the following relation holds in the time period following the connection of third phase current I_1:

$$I\_1 = I\_Bat - I\_ZK - I\_3 - I\_2.$$

Therefore, by applying the above relation, inferences may be made about phase current I_1 by measuring the DC link current during the time period following the connection of third phase current I_1.

The following relation holds in the time period following the connection of fourth phase current I_4:

$$I\_4 = I\_Bat - I\_ZK - I\_3 - I\_2 - I\_1.$$

Therefore, applying the above relation, inferences may be made about phase current I_4 by measuring the DC link current during the time period following the connection of fourth phase current I_4.

Consequently, within one control cycle, the following general relation holds:

$$I\_phase(new) = I\_Bat - I\_ZK - I\_phases(previous);$$

I_phase (new) being the respective, newly connected phase current;
I_Bat being the current of the DC voltage source;
I_ZK being the instantaneously measured DC link current; and
I_phases (previous) being the phase currents previously ascertained in the present control cycle.

In the case of the machine shown in FIG. 4, fluctuations in the DC link current are absorbed by DC-link capacitor 3a. Mostly only one DC current is drawn from the DC voltage source, for example, from a battery, due to the power supply inductances (inductance of the connection lines and inductance of suppression choke coils). Since a DC-link capacitor is not an ideal component having infinite capacitance, fluctuations in the capacitor current also result in fluctuations of the capacitor voltage. These capacitor voltage fluctuations essentially have two components:

On the one hand, due to the capacitance of the capacitor, there is either a rise or a drop in the capacitor voltage, depending on the momentary current direction.

$$U = 1/C \cdot \int I dt$$

For I=const., it holds that:

$$U(t) = U_o + \frac{I}{C} \cdot \Delta t.$$

On the other hand, the capacitor has an ohmic internal resistance which generates a voltage jump across the capacitor that is directly proportional to the fluctuating capacitor current:

$$U = R \cdot I$$

Therefore, the internal resistance of the DC-link capacitor is responsible for the voltage jump that occurs in each instance in response to a switching operation in accordance with FIG. 5a. The capacitance of the DC-link capacitor is responsible for the continuous voltage rise, respectively voltage drop between two successive voltage jumps. This means that inferences about the phase currents of the generator may be made given knowledge of the internal resistance of the DC-link capacitor on the basis of the voltage jumps, or given knowledge of the capacitance of the DC-link capacitor on the basis of the ramps of the capacitor voltage. It is thus possible to record the phase currents and the current of the DC voltage source using the measured voltage curve across the DC-link capacitor. The voltage jumps occurring at the switching instants, and/or the changes in voltage (ramps) occurring between two switching instants are evaluated.

Both internal resistance ESR of the DC-link capacitor, as well as capacitance C of the DC-link capacitor are heavily dependent on the temperature, aging effects and on manufacturing variances.

Figure 9:
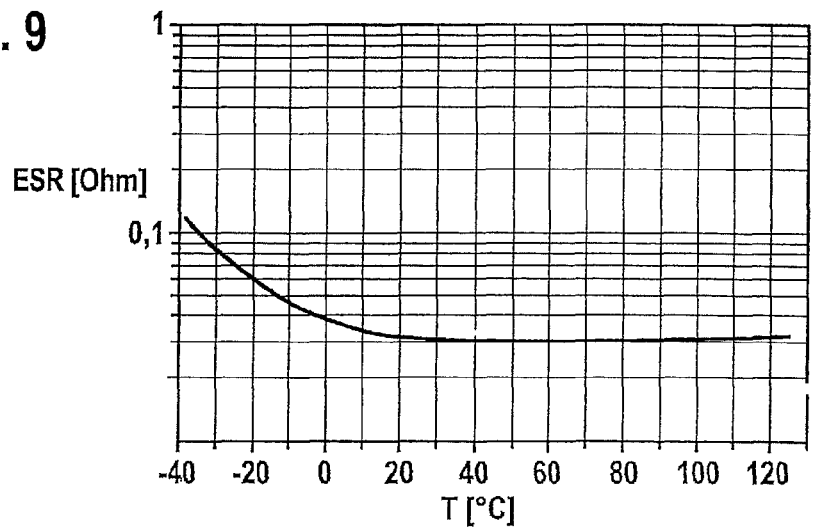
FIG. 9 shows a diagram for illustrating the dependence of the internal resistance of the DC-link capacitor on temperature.
Figure 10:
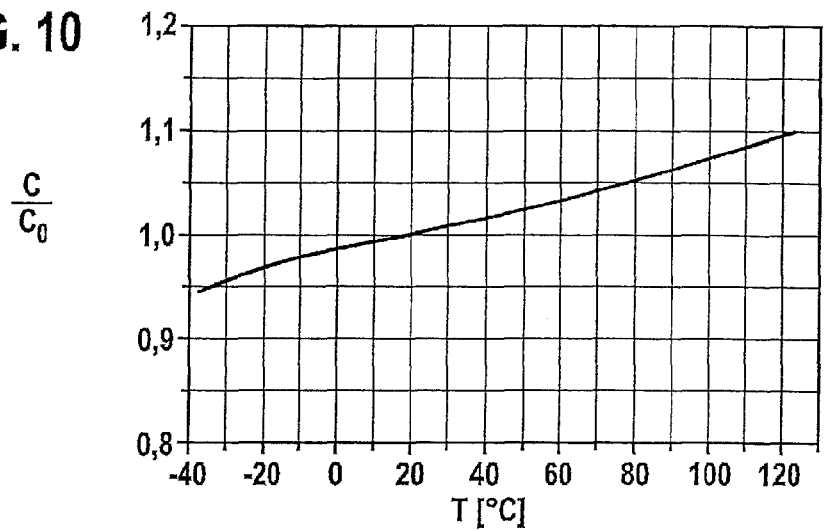
FIG. 10 shows a diagram for illustrating the dependence of the capacitance value of the DC-link capacitor on temperature.

FIG. 9 illustrates the dependence of internal resistance ESR on the temperature; FIG. 10 illustrates the dependence of the capacitance on the temperature.

It is, therefore, necessary to actively determine the current parameters, as mentioned, during operation of the machine in resting phases, for example, during a running-on phase, or in the case of a machine at rest.

This may be advantageously accomplished using a measurement of the temperature of the DC-link capacitor. Since this temperature has a significant influencing factor on internal resistance ESR, particularly if an electrolytic capacitor is present, this influencing factor may be counteracted using a temperature measurement in the sense of a precontrol.

In many cases, a temperature sensing is already provided with respect to the electrical system of a converter, for example, for monitoring purposes and/or as overload protection. This temperature sensing may also be advantageously used since, in the quiescent state, i.e., given a switched-off output stage, the temperature of the electronics deviates only negligibly from the temperature of the DC-link capacitor. A precontrol value for ESR and C of the capacitor may be ascertained via a characteristic map.

An additional or alternative option provides for impressing a defined current for determining the internal resistance. A fixed, effective voltage and, thus, a calculable current may be adjusted by setting a fixed pulse control factor, respectively duty cycle, given knowledge of the stator resistances. Instantaneous internal resistance ESR may be ascertained by observing, respectively measuring a voltage jump. The instantaneous capacitance of DC-link capacitor may also be determined by observing, respectively measuring a continuous voltage rise or voltage drop.

Another additional or alternative option provides for impressing a measurable excitation current. If a current is pulsed by a known ohmic resistor, the current may then be ascertained from the resistance and the measured voltage. This current may be utilized for calibrating the measurement system as a function of the measured voltage fluctuations. For this purpose, given a cold machine and a known phase resistance of the machine, a specific cycle ratio may be preset and the ensuing current utilized.

For externally excited machines, the possibility arises of pulsing an excitation current using current measurement, of using a current sensing system to measure the ensuing excitation current, and of also measuring the voltage jump across the DC link resulting from the clock pulsing. It is possible to determine the instantaneous internal resistance of the DC-link capacitor and the instantaneous capacitance of the DC-link capacitor by comparing a measured excitation current, on the one hand, and a measured voltage curve across the DC-link capacitor, on the other hand.

Alternatively, it is also possible to use a separate calibrating resistor that is used exclusively for calibrating the current determination process.

In another specific embodiment, it is also conceivable to provide one of the five existing phases with a phase current measurement; to calibrate the measuring method according to the present invention on the basis of this phase current measurement; and to undertake all further currents by observing the voltage across the DC link. To this end, the voltage jump must be evaluated by the measurable current. The actual ESR is then expressed as:

$$ESR = \frac{\Delta U}{I_{phas,meas}}.$$

The capacitance of the DC-link capacitor is then derived from the difference in the ramp before and after connection of the phase current:

$$C = \frac{I_{phase,meas}}{ramp_1 - ramp_2}$$

Figure 11:
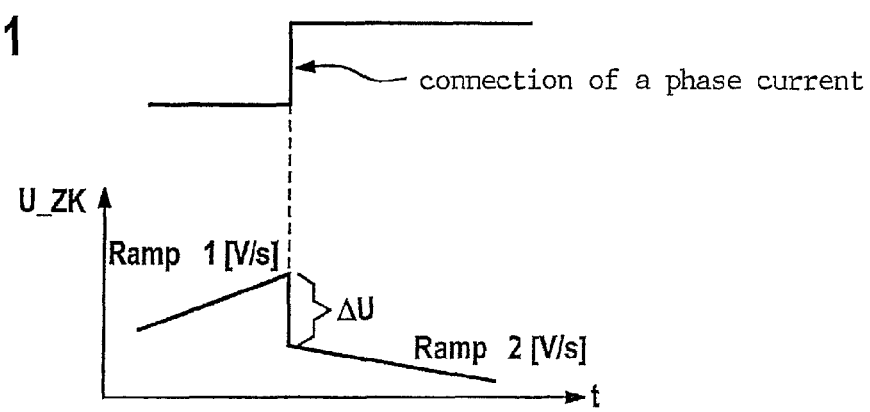
FIG. 11 shows a diagram for illustrating an example of a connecting of a phase current and the corresponding characteristic curve of the DC link voltage.

This is illustrated in FIG. 11, which shows an example of the phase current being connected and the corresponding curve of DC link voltage U_ZK.

Thus, a method in accordance with the present invention makes it possible to record a plurality of relevant currents in the controlling of a motor with the aid of an evaluation of the voltage curve across the DC-link capacitor. Thus reduces the hardware outlay required for current sensing in comparison with the related art. Moreover, by employing a method in accordance with the present invention, it is possible to determine relevant currents without increasing the total power loss of the system by utilizing the non-ideal properties of the DC-link capacitor.

What is claimed is:

1. A method for determining current in a polyphase machine connected to a DC voltage source and having a DC link provided with a DC-link capacitor and, per phase, a high-side switch and a low-side switch, the method comprising:

performing a measurement of a voltage curve across the DC-link capacitor; and determining, based on the measured voltage curve, at least one of a current of the DC voltage source and a phase current, wherein voltage jumps occurring in the measured voltage curve are evaluated to determine the at least one of the current of the DC voltage source and the phase current;

wherein the polyphase machine is controlled by center-aligned control, so that each of the voltage jumps occurs in response to each of a plurality of switching operations, so that there is a linearly rising voltage curve or a linearly falling voltage curve between two of successive ones of the voltage jumps, wherein an abrupt current variation occurs in response to each of the switching operations, and wherein a constant current characteristic curve occurs between two of successive ones of the abrupt current variations.

2. The method as recited in claim 1, wherein voltage ramps occurring in the measured voltage curve are evaluated.

3. The method as recited in claim 2, wherein the at least one of the current of the DC voltage source and the phase current is determined by taking into consideration an instantaneous internal resistance of the DC-link capacitor.

4. The method as recited in claim 3, wherein a temperature of the DC-link capacitor is measured to ascertain the internal resistance of DC-link capacitor.

5. The method as recited in claim 4, wherein a preexisting measured temperature value of the DC-link capacitor is used to ascertain the internal resistance of DC-link capacitor.

6. The method as recited in claim 5, wherein a defined current is applied, given the polyphase machine is at standstill, to determine the internal resistance of the DC-link capacitor.

7. The method as recited in claim 6, wherein a measurable defined current is applied to determine the internal resistance of the DC-link capacitor.

8. The method as recited in claim 4, wherein a phase current is measured for the purpose of calibrating a phase current, and further phase currents are determined using a measurement of the voltage curve across the DC-link capacitor.

* * * * *